(12) United States Patent
Lee

(10) Patent No.: US 8,164,138 B2
(45) Date of Patent: Apr. 24, 2012

(54) RECESSED CHANNEL TRANSISTOR

(75) Inventor: Jin-Woo Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 232 days.

(21) Appl. No.: 12/661,071

(22) Filed: Mar. 10, 2010

(65) Prior Publication Data

US 2010/0237408 A1  Sep. 23, 2010

(30) Foreign Application Priority Data

Mar. 23, 2009  (KR) ........................ 10-2009-0024434

(51) Int. Cl.
*H01L 29/78* (2006.01)
(52) U.S. Cl. ........ 257/330; 257/394; 257/395; 257/396; 257/397; 257/510; 257/E29.257; 257/E29.262
(58) Field of Classification Search .................. 257/330, 257/394–397, 510, E29.257, E29.262
See application file for complete search history.

(56) References Cited

U.S. PATENT DOCUMENTS

| | | | | |
|---|---|---|---|---|
| 5,021,355 | A * | 6/1991 | Dhong et al. | 438/270 |
| 5,492,858 | A * | 2/1996 | Bose et al. | 438/437 |
| 5,998,835 | A * | 12/1999 | Furukawa et al. | 257/330 |
| 6,043,135 | A * | 3/2000 | Noda | 438/404 |
| 6,312,360 | B1 * | 11/2001 | Shiban | 482/49 |
| 6,437,386 | B1 * | 8/2002 | Hurst et al. | 257/301 |
| 6,717,200 | B1 * | 4/2004 | Schamberger et al. | 257/302 |
| 6,794,249 | B2 * | 9/2004 | Palm et al. | 438/259 |
| 7,015,092 | B2 * | 3/2006 | Jaiprakash et al. | 438/248 |
| 7,371,645 | B2 * | 5/2008 | Muemmler et al. | 438/270 |
| 7,419,878 | B2 * | 9/2008 | Williams et al. | 438/270 |
| 2002/0167046 | A1 * | 11/2002 | Aoki et al. | 257/330 |
| 2005/0136631 | A1 * | 6/2005 | Jaiprakash et al. | 438/589 |
| 2007/0114600 | A1 * | 5/2007 | Hirler et al. | 257/330 |
| 2007/0138545 | A1 * | 6/2007 | Lin et al. | 257/330 |
| 2008/0157211 | A1 | 7/2008 | Wang | |
| 2009/0224312 | A1 * | 9/2009 | Taketani | 257/330 |
| 2009/0230464 | A1 * | 9/2009 | Taketani | 257/330 |
| 2009/0267126 | A1 * | 10/2009 | Wang et al. | 257/302 |
| 2010/0140693 | A1 * | 6/2010 | Hebert | 257/333 |

FOREIGN PATENT DOCUMENTS

| | | | |
|---|---|---|---|
| KR | 10-2006-0121066 A | 11/2006 | |
| KR | 10-2006-0128472 A | 12/2006 | |

* cited by examiner

*Primary Examiner* — Evan Pert
(74) *Attorney, Agent, or Firm* — Onello & Mello, LLP

(57) ABSTRACT

A recessed channel transistor includes an isolation layer provided in a semiconductor substrate to define an active region. A trench is provided in the semiconductor substrate to extend across the active region. A gate insulation layer covers a sidewall and a bottom face of the trench and an upper face of the semiconductor substrate adjacent to an upper edge of the trench, wherein a portion of the gate insulation layer on the upper surface of the semiconductor substrate adjacent to the upper edge of the trench and on the sidewall of the trench extending to a first distance downwardly from the upper edge of the trench has a thickness greater than that of a portion of the gate insulation layer on the remaining sidewall and the bottom face of the trench. A gate electrode fills up the trench having the gate insulation layer formed therein.

7 Claims, 7 Drawing Sheets

RECESSED CHANNEL TRANSISTOR

CROSS-REFERENCE TO RELATED PATENT APPLICATION

This application claims priority under 35 U.S.C. §119 to Korean Patent Application No. 10-2009-0024434, filed on Mar. 23, 2009 in the Korean Intellectual Property Office (KIPO), the contents of which are herein incorporated by reference in their entirety.

BACKGROUND

1. Field

Exemplary embodiments relate to a recessed channel transistor and a method of manufacturing the same. More particularly, example embodiments relate to a recessed channel transistor capable of improving current performance of a dynamic random access memory (DRAM) semiconductor cell and a method of manufacturing the same.

2. Description of the Related Art

As DRAM cells are highly integrated according to a decrease in a design rule of a semiconductor device, a channel length of a MOS transistor is greatly reduced. However, a short channel effect or a punch through effect may occur frequently due to the decrease in the channel length. In order to minimize the above problems, various transistors capable of preventing the short channel effect and improving refresh characteristics have been researched. For example, a channel length of a recessed channel transistor may be increased physically without an increase in a lateral area of a gate electrode.

However, in a conventional recessed channel transistor, when a drain voltage (Vd) is applied to a capacitor that is electrically connected to a NMOS transistor, a gate induced drain leakage (GIDL) problem may occur. In order to prevent the leakage current, a predetermined negative voltage may be applied to a gate electrode of a turn-off transistor adjacent to a turn-on transistor. However, it is difficult to efficiently insulate between a gate electrode and an impurity region in a transistor having a recessed gate electrode.

SUMMARY

Exemplary embodiments of the present inventive concept provide a recessed channel transistor capable of preventing a gate induced drain leakage.

Exemplary embodiments of the present inventive concept provide a method of manufacturing the recessed channel transistor.

According to an exemplary embodiment, a recessed channel transistor includes an isolation layer provided in a semiconductor substrate to define an active region. A trench is provided in the semiconductor substrate to extend across the active region. A gate insulation layer covers a sidewall and a bottom face of the trench and an upper face of the semiconductor substrate adjacent to an upper edge of the trench, wherein a portion of the gate insulation layer on the upper surface of the semiconductor substrate adjacent to the upper edge of the trench and on the sidewall of the trench extending to a first distance downwardly from the upper edge of the trench has a thickness greater than that of a portion of the gate insulation layer on the remaining sidewall and the bottom face of the trench. A gate electrode fills up the trench having the gate insulation layer formed therein.

In one exemplary embodiment, the gate insulation layer may include a first gate insulation layer on the upper surface of the semiconductor substrate, and the first gate insulation layer may have a stacked structure of a thermal oxidation layer pattern and a buffer layer pattern. In another exemplary embodiment, the buffer layer pattern may include at least one of silicon nitride and medium temperature oxide.

In one exemplary embodiment, the gate insulation layer may include a second gate insulation layer on the sidewall of the trench extending to the first distance downwardly from the upper edge of the trench. In another exemplary embodiment, the second gate insulation layer may include a silicon oxynitride layer pattern. Alternatively, the second gate insulation layer may have a stacked structure of a silicon oxide layer pattern and a silicon oxynitride layer pattern.

In one exemplary embodiment, the trench may include a lower portion having a round inner wall profile, and an upper portion on the lower portion and having a vertical sidewall profile.

According to another aspect of the present inventive concept, in a method of manufacturing a recessed channel transistor, an isolation layer is formed in a semiconductor substrate to define an active region. A trench is formed in the semiconductor substrate to extend across the active region. A gate insulation layer is formed on a sidewall and a bottom face of the trench and on an upper face of the semiconductor substrate adjacent to an upper edge of the trench, wherein a portion of the gate insulation layer on the upper surface of the semiconductor substrate adjacent to the upper edge of the trench and on the sidewall of the trench extending to a first distance downwardly from the upper edge of the trench has a thickness greater than that of a portion of the gate insulation layer on the remaining sidewall and the bottom face of the trench. A gate electrode is formed to fill up the trench having the gate insulation layer formed therein.

In one exemplary embodiment, the method may further include, prior to forming the trench, sequentially depositing a thermal oxidation layer, a buffer layer and a mask pattern on the semiconductor device and etching the buffer layer and the thermal oxidation layer using the mask pattern as an etching mask to form a thermal oxidation layer pattern and a buffer layer pattern on the semiconductor substrate.

In another exemplary embodiment, the buffer layer pattern may include at least one of silicon nitride and medium temperature oxide.

In one exemplary embodiment, forming the gate insulation layer may include forming a silicon oxide layer in the trench, forming a spacer of silicon nitride on the sidewall of the trench extending to the first distance downwardly from the upper edge of the trench, and performing a thermal oxidation process to form a gate oxide layer on an inner wall of the trench except for a portion of the sidewall of the trench having the spacer and to form a silicon oxynitride layer on the portion of the sidewall of the trench having the spacer.

In another exemplary embodiment, forming the spacer may include depositing silicon nitride on the semiconductor substrate having the trench where the silicon oxide layer is formed, to form a spacer layer, and performing an anisotropic process on the spacer layer until the semiconductor substrate is exposed through the bottom face of the trench, to form the spacer on the sidewall of the trench extending to the first distance downwardly from the upper edge of the trench In another exemplary embodiment, the method may further include, after forming the spacer, performing an isotropic process using the spacer as a mask such that a lower portion of the trench is enlarged to have a ball shape, forming a photoresist pattern to cover the active region of the semiconductor substrate, and removing the buffer layer pattern and the thermal oxidation layer pattern formed on a peripheral circuit region of the semiconductor substrate and exposed by the photoresist pattern.

As mentioned above, according to a recessed channel transistor and a method of manufacturing the same, a portion of the gate insulation layer having silicon oxynitride on the sidewall portion of the trench may have a thickness greater than that of a portion of the gate insulation layer on the bottom face of the trench, to thereby prevent a gate induced drain leakage from occurring between the impurity region and the recessed gate electrode in the trench. Further, as the thermal oxidation layer pattern and the buffer layer pattern are formed to have a relatively greater thickness on the semiconductor substrate adjacent to the upper edge of the trench, a gate induced drain leakage may be prevented from occurring in the upper edge of the trench under the gate electrode. Further, the gate insulation layer may be formed to have a smaller thickness on the channel region under the bottom face of the trench, to thereby improve current performance of the cell transistor.

BRIEF DESCRIPTION OF THE DRAWINGS

The foregoing and other features and advantages of the inventive concept will be apparent from the more particular description of preferred aspects of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Figure 1:
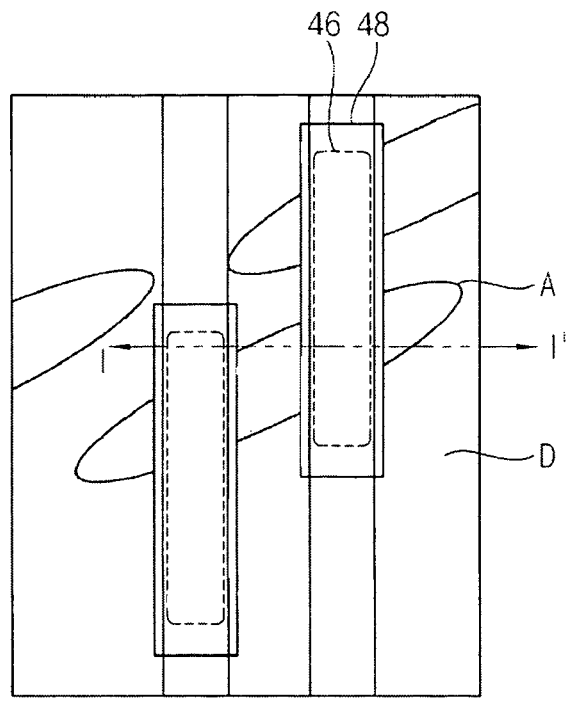
FIG. 1 is a plan view illustrating a recessed channel transistor, in accordance with an exemplary embodiment of the present inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Embodiment 1

Figure 2:
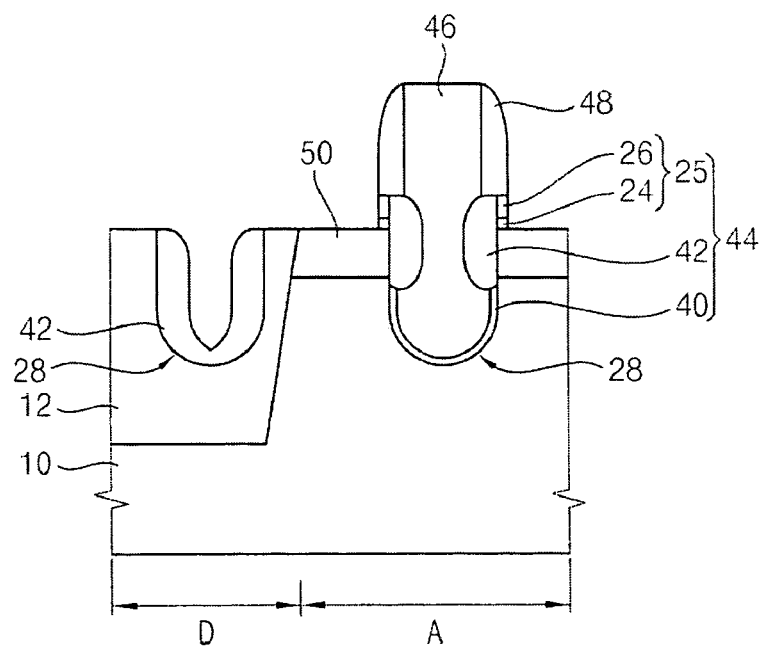
FIG. 2 is a cross-sectional view taken along the line I-I' of FIG. 1, in accordance with an exemplary embodiment of the present inventive concept.

FIG. 1 is a plan view illustrating a recessed channel transistor in accordance with an exemplary embodiment. FIG. 2 is a cross-sectional view taken along line I-I' of FIG. 1. The present exemplary embodiment relates to a cell transistor of a DRAM memory device having a recessed gate electrode.

Referring to FIGS. 1 and 2, an isolation layer 12 is provided in a semiconductor substrate 10 to define an active region (A). The isolation layer 12 may be a shallow trench isolation layer. At least one trench 28 is provided in the semiconductor substrate 10 to extend across the active region (A) of the semiconductor substrate 10. The trench 28 may have a shape recessed to a predetermined depth from a surface of the semiconductor substrate 10. A gate insulation layer 44 is provided to cover a sidewall and a bottom face of the trench 28 and the upper surface of the semiconductor substrate 10 adjacent to an upper edge of the trench 28. The gate insulation layer 44 may include first, second and third gate insulation layers 25, 42 and 40. The first gate insulation layer 25 is formed on the upper surface of the semiconductor substrate 10 adjacent to the upper edge of the trench 28. The second gate insulation layer 42 is formed on the sidewall of the trench 28 extending to a first distance from the upper edge of the trench 28. The third gate insulation layer 40 is formed on the bottom face of the trench 28. For example, the first distance may be smaller than the total length of the sidewall of the trench 28. The first distance may be identical to or larger than a depth of an impurity region 50 adjacent to the trench 28.

In an exemplary embodiment, the first gate insulation layer 25 may have a stacked structure of a thermal oxidation layer pattern 24 and a buffer layer pattern 26 formed on the thermal oxidation layer pattern 24. The buffer layer pattern 26 may include, for example, silicon nitride or MTO (medium temperature oxide). The buffer layer pattern 26 may be formed by, for example, a thermal oxidation process, a chemical vapor deposition process, a physical vapor deposition process or an atomic layer deposition process. The second gate insulation layer 42 may be a silicon oxynitride layer pattern including silicon oxynitride. For example, after forming a spacer of silicon nitride in the trench 28, the spacer may be oxidized to form the second gate insulation layer 42. The third gate insulation layer 40 may be a gate oxide layer formed by a thermal oxidation process. For example, the third gate insulation layer 40 and the thermal oxidation layer pattern 24 may be gate oxide layers formed by substantially the same thermal oxidation processes. The third gate insulation layer 40 and the thermal oxidation layer pattern 24 may have a first thickness. The first thickness may be identical to or greater than 100 Å. When the first thickness is smaller than 100 Å, a gate induced leakage current may occur.

The gate insulation layer 44 on the upper surface of the semiconductor substrate 10 adjacent to the upper edge of the trench 28 and on the sidewall of the trench 28 extending to a first distance from the upper edge of the trench 28 may have a thickness greater than that of the gate insulation layer 44 on the remaining sidewall and the bottom face of the trench 28. That is, the thicknesses of the first and second gate insulation layers 25 and 42 may be greater than the third gate insulation layer 40. This is due to the fact that, if the thickness of the gate insulation layer 44 between the upper edge portion of the trench 28 and a gate electrode 46 is relatively smaller than the first distance, a gate induced drain leakage (GIDL) problem may occur. Thus, as the thicknesses of the first and second gate insulation layers 25 and 42 of the gate insulation layer 44 positioned between the impurity region 50 and the gate electrode 46 and a gate spacer 48 are relatively greater than the thickness of the gate insulation layer 44 on the remaining sidewall portion and the bottom face of the trench 28, the gate induced drain leakage may be prevented from occurring.

The gate electrode 46 is provided to fill the trench 28 having the gate insulation layer 44 formed therein. The gate electrode 46 may include an upper portion extending upwardly from the surface of the substrate 10 and a lower portion having a shape recessed from the surface of the semiconductor substrate 10.

The gate spacer 48 is formed on both sidewalls of the gate electrode 46 extending from the semiconductor substrate 10. The impurity region 50 is formed on both sides of the gate electrode 46 in the semiconductor substrate 10. Thus, a channel region may be formed under a side portion and a lower portion of the gate electrode 46. Accordingly, a MOS transistor including the gate electrode 46 may have a recessed channel.

As mentioned above, as the thicknesses of the first and second gate insulation layers 25 and 42 on the semiconductor substrate 10 adjacent to the impurity region 50 and on the sidewall of the trench 28 are greater than the thickness of the third gate insulation layer 40 on the bottom face of the trench 28, a gate induced drain leakage may be prevented from occurring between the impurity region 50 and the recessed gate electrode 46 in the trench 28. Further, as the thermal oxidation layer pattern 24 and the buffer layer pattern 26 are formed to have a relatively greater thickness on the semiconductor substrate 10 adjacent to the upper edge of the trench 28, a gate induced drain leakage may be prevented from occurring under the gate spacer 48 in the upper edge of the trench 28. Further, the third gate insulation layer 40 may be formed to have a smaller thickness on the channel region under the bottom face of the trench 28, to thereby improve current performance of the cell transistor.

Hereinafter, a method of manufacturing a recessed channel transistor of FIG. 1, in accordance with the exemplary embodiment, will be described with reference to FIGS. 2 to 9.

FIGS. 3 to 9 are cross-sectional views illustrating a method of manufacturing the recessed channel transistor of FIGS. 1 and 2, in accordance with exemplary embodiment of the present inventive concept.

Figure 3:
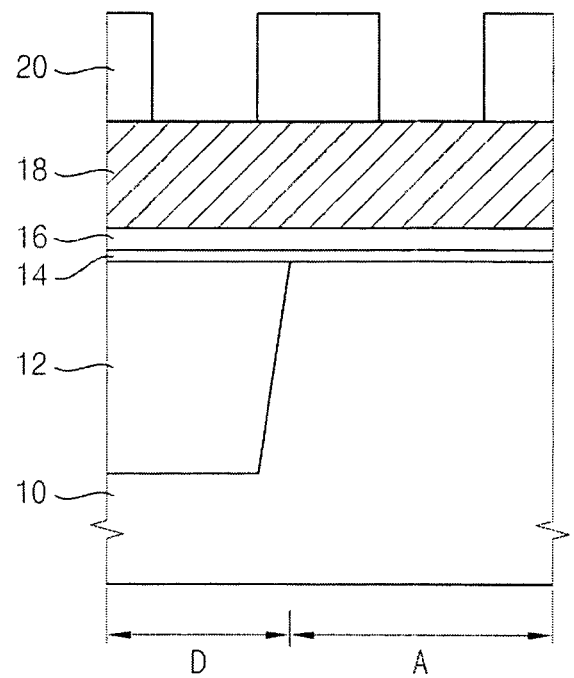
FIGS. 3 to 9 are cross-sectional views illustrating a method of manufacturing the recessed channel transistor of FIGS. 1 and 2, in accordance with the exemplary embodiment of the present inventive concept.

Referring to FIG. 3, a STI (shallow trench isolation) process is performed on a semiconductor substrate 10 to form an isolation layer 12 defining an active region (A) in the semiconductor substrate 10. A thermal oxidation layer 14, a buffer layer 16 and a mask layer 18 are deposited on the semiconductor substrate 10 including the active region (A) and an isolation region (D). Then, a first photoresist pattern 20 is formed on the mask layer 18. The first photoresist pattern 20 may serve as an etching mask for forming a trench where a recessed gate electrode is to be formed in the mask layer 18.

The thermal oxidation layer 14 may reduce stresses that are applied to a surface of the semiconductor substrate 10 before forming the mask layer 20. The thermal oxidation layer 14 may be formed to have a thickness of 90 to 110 Å. The buffer layer 16 may be formed to protect the semiconductor substrate 10 during a subsequent etch process. The buffer layer 16 may be used as an auxiliary insulation layer between the gate electrode 46, as illustrated in FIG. 2, and the gate insulation layer 44, as illustrated in FIG. 2. A thickness of the buffer layer 16 may be determined based on an etching depth of a subsequent etch process. For example, the thickness of the buffer layer 16 may be greater than that of the thermal oxidation layer 14.

Figure 5:
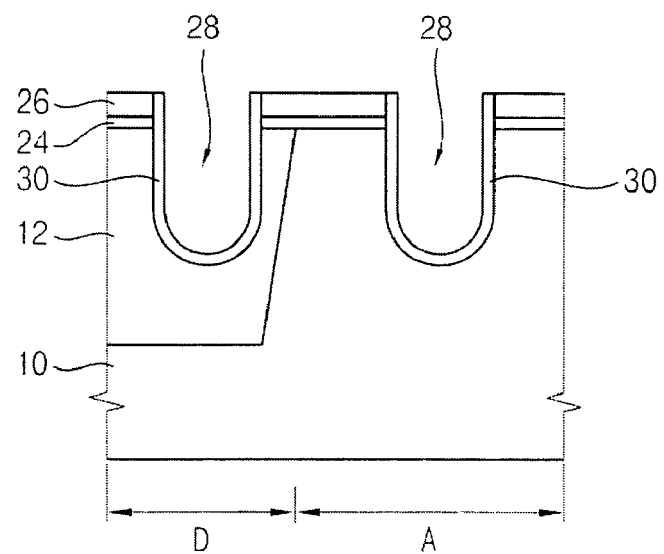

The mask layer 18 may be formed using a material having an etch selectivity with respect to the semiconductor substrate 10. This is because the etch process for forming the trench 18 in the semiconductor substrate 10, as illustrated in FIG. 5, is performed using the mask layer 18. In an exemplary embodiment, the semiconductor substrate 10 may include a silicon substrate. The buffer layer 16 may be formed using silicon nitride or MTO. The buffer layer 16 may be formed by, for example, a thermal oxidation process, a chemical vapor deposition process, a physical vapor deposition process or an atomic layer deposition process. In a case in which the buffer layer 16 is formed using MTO, the mask layer 18 may be formed using silicon nitride.

Figure 4:
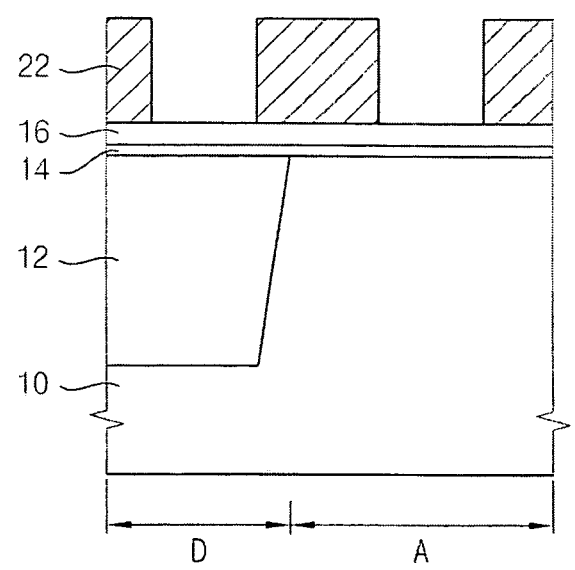

Referring to FIG. 4, the mask layer 18 is patterned using the first photoresist pattern 20 as an etching mask to form a mask pattern 22 on the buffer layer 16. The mask pattern 22 may be an etching mask for forming the trench 28 in the semiconductor substrate 10 to define a gate forming region in the active region (A) of the semiconductor substrate 10. Then, the first photoresist pattern 20 is removed from the semiconductor substrate 10.

Referring to FIG. 5, the buffer layer 16 and the thermal oxidation layer 14 are etched using the mask pattern 22 as an etching mask until the surface of the semiconductor substrate 10 is exposed, to form a thermal oxidation layer pattern 24 and a buffer layer pattern 26 under the mask pattern 22. Accordingly, the surfaces of the semiconductor substrate 10 and the isolation layer 12 are exposed through the mask pattern 22.

Then, the semiconductor substrate 10 and the isolation layer 12 exposed through the mask pattern 22 are etched to form the trenches 28.

In an example embodiment, in a case in which the mask pattern 22 is formed using the same material as the semiconductor substrate 10, the mask pattern 22 may be removed in the process of forming the trenches 28. Alternatively, in a case in which the mask pattern 22 is formed using different material from the semiconductor substrate 10, after forming the trenches, an additional process may be performed to remove the mask pattern 22. For example, in a case in which the mask pattern 22 includes silicon nitride, the mask pattern 22 may be removed using a gas including $CF_4$, $CHF_3$, $CH_2F_2$, Ar, $O_2$ or a mixture thereof. During this process step, the buffer layer pattern 26 and the thermal oxidation layer pattern 24 remain on the semiconductor substrate 10.

A thermal oxidation process is performed on the semiconductor substrate 10 including the trenches 28 formed therein to form a silicon oxide layer 30 on an inner wall of the trenches 28. In the thermal oxidation process, the semiconductor substrate 10 is thermally treated at a high temperature under an oxygen gas containing atmosphere to react silicon of the semiconductor substrate 10 and the oxygen gas, to form the silicon oxide layer 30 on the inner wall of the trenches 28 and a sidewall portion of the buffer layer pattern 26.

Figure 6:
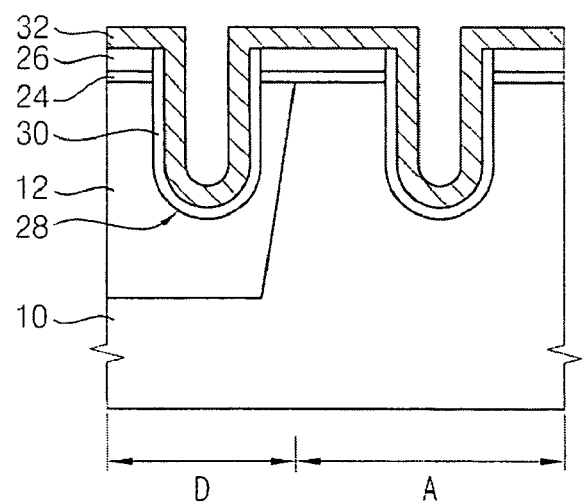
Figure 7:
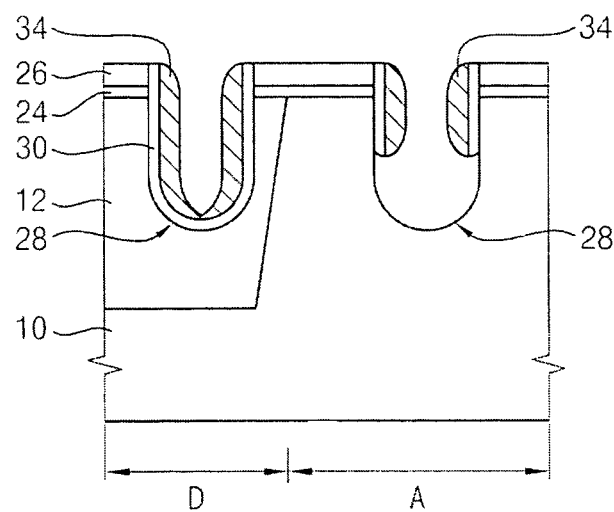

Referring to FIG. 6, a spacer layer 32 is formed on the silicon oxide layer 30 on the inner wall of the trench 28 and on the buffer layer 26. For example, silicon nitride is deposited to a uniform thickness to form the spacer layer 32. The spacer layer 32 is etched, as illustrated in FIG. 7, by a subsequent etch process to be a spacer 34. The spacer 34 may be used as an etching mask for etching a lower portion of the trench 28 in the active region (A).

Referring to FIG. 7, an anisotropic etch process is performed on the spacer layer 32 until the surface of the semiconductor substrate 10 under a bottom face of the trench 28 is exposed, to form the spacer 34 on a sidewall of the trench 28 having the silicon oxide layer 30 formed thereon. The spacer 34 may be formed on the sidewall of the trench 28 in the active region (A) extending to a first distance from the upper edge of the trench 28. The spacer 34 may be formed using a material having an etch selectivity with respect to the buffer layer pattern 26. The spacer 34 in the active region (A) may be formed only on the sidewall of the trench 28, while the spacer 34 in the isolation layer 12 in the isolation region (D) may be formed on the sidewall and the bottom face of the trench 28.

In another exemplary embodiment, an isotropic etch process may be performed using the spacer 34 as an inner mask to enlarge a lower portion of the trench 28 exposed through the spacer 34 in the active region (A). Accordingly, the lower portion of the trench 28 may have an enlarged ball shape. By performing the isotropic etch process, the channel length under the recessed gate electrode may be increased to prevent a short channel effect and to improve refresh characteristics.

Figure 8:
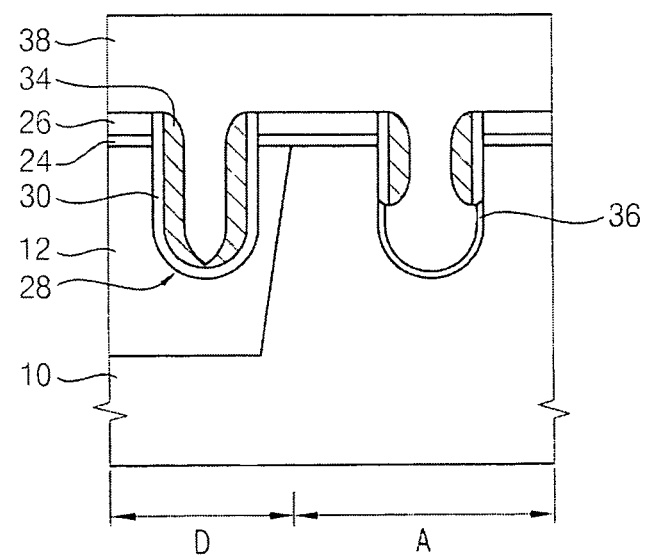

Referring to FIG. 8, a thermal oxidation process is performed on the semiconductor substrate 10 to form a protecting layer 36 on the exposed semiconductor substrate 10 in the trench 28 in the active region (A). The protecting layer 36 may be formed using silicon oxide.

In order to remove the buffer layer pattern 26 and the thermal oxidation layer pattern 24 formed in a peripheral circuit region (not illustrated), a second photoresist pattern 38 may be formed to cover the active region (A) of the semiconductor substrate 10. A photoresist is coated on the resultant structure and then is etched to form the second photoresist pattern that exposes the peripheral circuit region.

Figure 9:
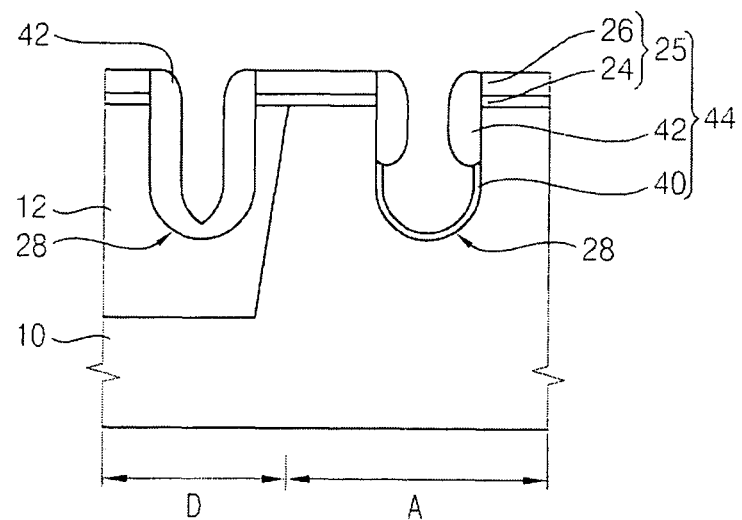

Referring to FIG. 9, the buffer layer pattern 26 and the thermal oxidation layer pattern 24 in the peripheral circuit region are sequentially removed using the second photoresist pattern 38 as a mask. The buffer layer pattern 26 and the thermal oxidation layer pattern 24 may be removed by an etch process using plasma.

Then, the second photoresist pattern 38 in the active region (A) of the semiconductor substrate 10 is removed by an ashing process using ozone. The second photoresist pattern 38 may be removed by a wet etch process using a sulfuric acid ($H_2SO_4$) solution and an ozone solution. As the second photoresist pattern 38 is removed, the active region (A) of the semiconductor substrate 10 is exposed. The protecting layer 36 on the bottom face of the trench 28 may be removed together with the second photoresist pattern 38.

Then, a thermal oxidation process is performed on the semiconductor substrate 10 under an oxygen gas containing atmosphere to form a gate insulation layer 44 on the sidewall and the bottom face of the trench 28 in the active region (A). The thermal oxidation layer pattern 24 and the buffer layer pattern 26 on the semiconductor substrate 10 adjacent to the upper edge of the trench 28 in the active region (A) may be used as a first gate insulation layer 25. By the thermal oxidation process, a second gate insulation layer 42 is formed on the sidewall of the trench 28 extending to a first distance from the upper edge of the trench 28 and a third gate insulation layer 40 is formed on the remaining portion of the sidewall of the trench 28 and the bottom face of the trench 28. The first, second and third gate insulation layers 25, 42, 40 serve as the gate insulation layer 44 of a transistor having a recessed gate electrode.

The portion of the gate insulation layer 44 adjacent to the upper edge of the trench 28 and extending to the first distance from the upper edge of the trench 28 may have a thickness greater than that of the portion of the gate insulation layer 44 on the remaining sidewall portion and the bottom face of the trench 28. This is because, in a case in which the thickness of the gate insulation layer 44 between the upper edge portion of the trench 28 and the gate electrode 46 is relatively small, a gate induced drain leakage problem may occur. Accordingly, as the thickness of the gate insulation layer 44 adjacent to the upper edge of the trench 28 and extending to the first distance from the upper edge of the trench 28 is relatively greater than the thickness of the gate insulation layer 44 on the remaining sidewall portion and the bottom face of the trench 28, the gate induced drain leakage may be prevented from occurring.

For example, in the thermal oxidation process, the gate oxide layer 40 may be formed on the inner portion of the trench 28 where the spacer 34 is not formed, and the spacer 34 and the silicon oxide layer 30 may be oxidized to form a silicon oxynitride layer 42 on the sidewall of the trench 28. The silicon oxynitride layer 42 may be formed to have a thickness greater than the gate oxide layer 40. Accordingly, when the channel is formed under the gate oxide layer 40, the gate electrode and an impurity region may be efficiently insulated from each other by the silicon oxynitride layer 42 on the sidewall of the trench 28. The gate oxide layer 40, the silicon oxynitride layer 42 and the thermal oxidation layer pattern 24 and the buffer layer pattern 26 on the semiconductor substrate 10 may be used as the gate insulation layer 44 of a MOS transistor.

In an exemplary embodiment, the gate oxide layer 40 may be the same thermal oxidation layer as the thermal oxidation layer pattern 24 formed by a thermal oxidation process. For example, a thickness of the gate oxide layer 40 may be substantially identical to that of the thermal oxidation layer pattern 24. The third gate insulation layer 40 and the thermal oxidation layer pattern 24 may be oxide layers having a first thickness. The first thickness may be identical to or greater than 100 Å. When the first thickness is smaller than 100 Å, a gate induced leakage current may occur.

The thermal oxidation layer pattern 24 and the buffer layer pattern 26 are formed on the semiconductor substrate 10 adjacent to the upper edge of the trench 28. Accordingly, the thermal oxidation layer pattern 24 and the buffer layer pattern 26 may be used as an auxiliary insulation layer together with the second gate insulation layer 42 on the sidewall of the trench 28, to thereby prevent a gate induced drain leakage from occurring under the gate spacer 48, as illustrated in FIG. 2. Further, the third gate insulation layer 40 may be formed to have a relatively small thickness in the channel region of the recessed channel transistor, to thereby improve current performance of the cell transistor.

Only the silicon oxynitride layer 42 is formed within the trench 28 formed in the isolation layer 12 of the isolation region (D).

Referring to FIG. 2, the trench 28 in the active region (A) is filled with a conductive material to form a gate electrode 46 on the buffer layer pattern 26 and the gate insulation layer 44 of the semiconductor substrate 10. The gate electrode 46 may include an upper portion extending upwardly from the surface of the substrate 10 and a lower portion having a shape recessed from the surface of the semiconductor substrate 10. For example, a conductive layer (not illustrated) may be formed to fill the trench 28 and to cover the buffer layer pattern 26 and then is partially removed to form the gate electrode 46.

Then, a gate spacer 48 is formed on both sidewalls of the gate electrode 46 extending from the semiconductor substrate 10. The gate spacer 48 may be formed using silicon nitride. Impurities are implanted into the semiconductor substrate 10 in both sides of the gate electrode 46 having the gate spacer 48, to form an impurity region 50. Thus, a channel region may be formed under the side portion and the lower portion of the gate electrode 46. Accordingly, a MOS transistor including gate electrode 46 may have the recessed channel.

The second gate insulation layer 42 of the silicon oxynitride layer between the impurity region 50 and the gate electrode 46 is connected to the first gate insulation layer 25 including the buffer layer pattern 26 and the thermal oxidation layer pattern 24 stacked on the semiconductor substrate 10. The third gate insulation layer 40 is formed between the gate electrode and the bottom face and the remaining sidewall of the trench 28. Accordingly, because the first and second gate insulation layers 25 and 42 have relatively greater thicknesses between the gate electrode 46 and the impurity region 50, a gate induced drain leakage may be prevented from occurring in the first and second gate insulation layers 25 and 42 between the gate electrode 46 and the impurity region 50.

Embodiment 2

A recessed channel transistor according to the present embodiment is substantially the same as in Embodiment 1 except that a gate insulation layer is formed in a trench and on a semiconductor substrate adjacent to an upper edge of the trench. Thus, any further explanations with respect to the same elements will be omitted and the gate insulation layer will be explained in detail.

Figure 10:
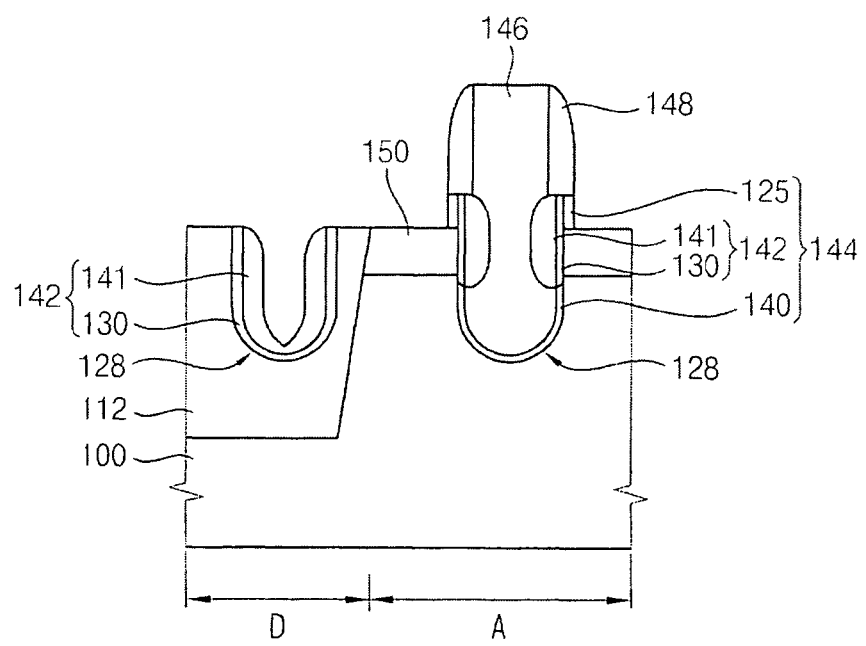
FIG. 10 is a cross-sectional view illustrating a recessed channel transistor, in accordance with another exemplary embodiment of the present inventive concept.

FIG. 10 is a cross-sectional view illustrating a recessed channel transistor, in accordance with another exemplary embodiment of the present inventive concept. The recessed channel transistor according to the present embodiment is substantially the same as in Embodiment 1 except a gate insulation layer is formed in a trench and on a semiconductor substrate adjacent to an upper edge of the trench.

The recessed channel transistor 110 may include a semiconductor substrate 100, an isolation layer 112, a trench 128, a gate electrode 146, a gate spacer 148 and an impurity region 150 which are the same as described with reference to FIGS. 1 and 2.

Referring to FIG. 10, a gate insulation layer 144 is provided to cover a sidewall and a bottom face of the trench 128 in the active region (A) and an upper surface of the semiconductor substrate 100 adjacent to an upper edge of the trench 128 in the active region (A). The gate insulation layer 144 may include first, second and third gate insulation layers 125, 142 and 140. The first gate insulation layer 125 is formed on the upper surface of the semiconductor substrate 100 adjacent to the upper edge of the trench 128. The second gate insulation layer 142 is formed on the sidewall of the trench 128 extending to a first distance from the upper edge of the trench 128. The third gate insulation layer 140 is formed on the bottom face of the trench 28. For example, the first and second gate insulation layer 125 and 142 may have thicknesses greater than that of the third gate insulation layer 140.

In an example embodiment, the first gate insulation layer 125 may include, for example, silicon nitride, MTO or a thermal oxide. The first gate insulation layer 125 may be formed by, for example, a thermal oxidation process, a chemical vapor deposition process, a physical vapor deposition process or an atomic layer deposition process. The second gate insulation layer 142 may have a stacked structure of a silicon oxide layer pattern 130 and a silicon oxynitride layer pattern 141. For example, the silicon oxide layer pattern 130 may be formed by a thermal oxidation process. After forming a spacer of silicon nitride on the silicon oxide layer pattern 130, the spacer may be oxidized to form the silicon oxynitride layer pattern 141. The third gate insulation layer 140 may be a gate oxide layer formed by a thermal oxidation process. The silicon oxide layer pattern 130 and the third gate insulation layer 140 may be a gate oxide layer formed by a thermal oxidation processes. The silicon oxide layer pattern 130 and the third gate insulation layer 140 may have a first thickness. The first thickness may be identical to or greater than 100 Å. When the first thickness is smaller than 100 Å, a gate induced leakage current may occur.

Only the second gate insulation layer 142 including the stacked structure of the silicon oxide layer pattern 130 and the silicon oxynitride layer pattern 141 is formed within the trench 128 formed in the isolation layer 112 of the isolation region (D). The second gate insulation layer 142 in the isolation layer 112 in the isolation region (D) may be formed on the sidewall and the bottom face of the trench 128.

As the second gate insulation layer 142 has a stacked structure of the silicon oxide layer pattern 130 and the silicon oxynitride layer pattern 141, insulation properties between the gate electrode 146 and the impurity region 150 in the sidewall of the trench 128 may be improved as compared with the single layer structure in Embodiment 1. Accordingly, as the second gate insulation layer 142 of the gate insulation layer 144 positioned between the impurity region 150 and the gate electrode 146 in the trench 128 is formed to have a relatively greater thickness, the gate induced drain leakage may be prevented from occurring.

Embodiment 3

A recessed channel transistor according to the present embodiment is substantially the same as in Embodiment 1 except for a shape of a trench and except that a gate insulation layer is formed in the trench and on a semiconductor substrate adjacent to an upper edge of the trench. Thus, any further explanations with respect to the same elements will be omitted, and the trench and the gate insulation layer will be explained in detail.

Figure 11:
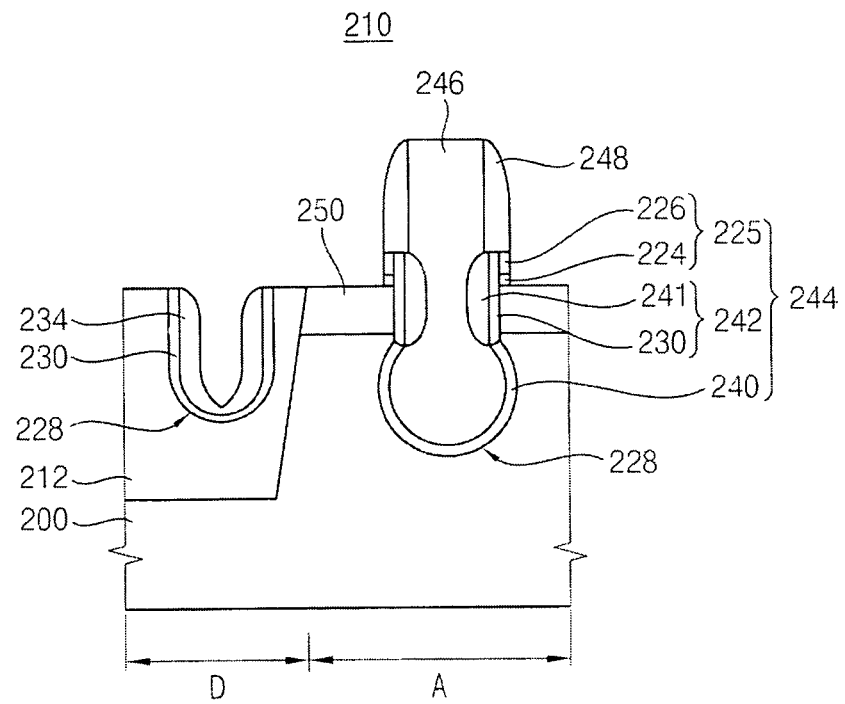
FIG. 11 is a cross-sectional view illustrating a recessed channel transistor, in accordance with another exemplary embodiment of the present inventive concept.

FIG. 11 is a cross-sectional view illustrating a recessed channel transistor, in accordance with another exemplary embodiment of the present inventive concept. The recessed channel transistor according to the present embodiment is substantially the same as in Embodiment 1 except for a shape of a trench and except that a gate insulation layer is formed in the trench and on a semiconductor substrate adjacent to an upper edge of the trench.

A recessed channel transistor 210 may include a semiconductor substrate 200, an isolation layer 212, a gate electrode 246, a gate spacer 248 and an impurity region 250 which are the same as described with reference to FIGS. 1 and 2.

Referring to FIG. 11, a trench 228 in an active region (A) has a lower portion having an enlarged ball shape and an upper portion. The lower portion of the trench 228 may have a round inner wall profile, and the upper portion of the trench 228 may have a vertical sidewall profile. The lower portion having the round inner wall profile may make a channel length longer under the recessed gate electrode 246 provided in the lower portion. Accordingly, the channel length may be increased by the trench 228 having the enlarged lower portion to prevent a short channel effect and to improve refresh characteristics.

A gate insulation layer 244 is provided to cover a sidewall and a bottom face of the trench 228 in the active region (A) and an upper surface of the semiconductor substrate 200 adjacent to an upper edge of the trench 228 in the active region (A). The gate insulation layer 244 may include first, second and third gate insulation layers 225, 242 and 240. The first gate insulation layer 225 is formed on the upper surface of the semiconductor substrate 100 adjacent to the upper edge of the trench 228. The second gate insulation layer 242 is formed on the sidewall of the trench 228 extending to a first distance from the upper edge of the trench 228. The third gate insulation layer 240 is formed on the bottom face of the trench 228. For example, the first and second gate insulation layer 225 and 242 may have thicknesses greater than that of the third gate insulation layer 240.

Figure 12:
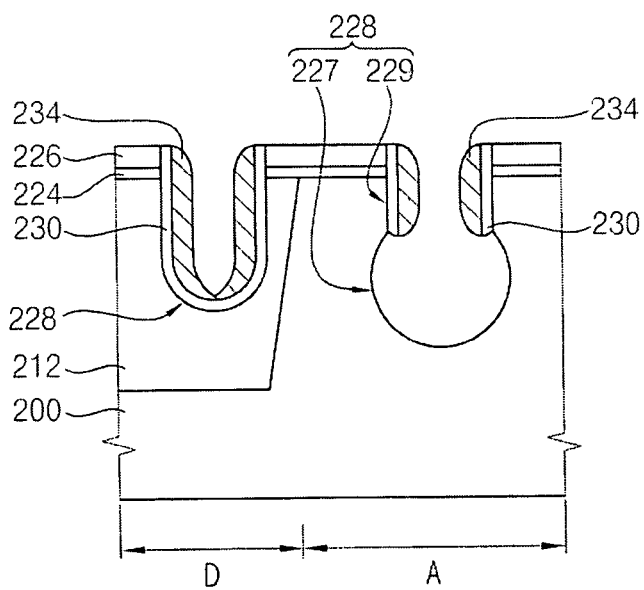
FIGS. 12 and 13 are cross-sectional views illustrating a method of manufacturing the recessed channel transistor of FIG. 11, in accordance with the exemplary embodiment of the present inventive concept.
Figure 13:
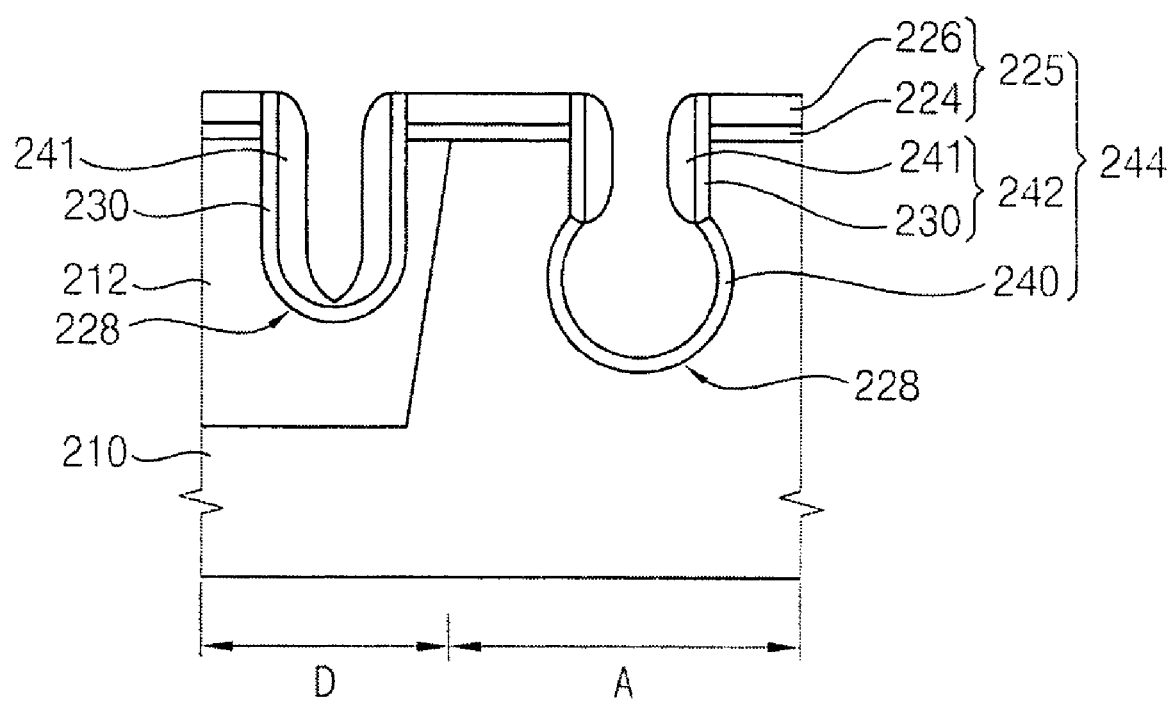

In an example embodiment, the first gate insulation layer 225 may be a stacked structure including a thermal oxidation layer pattern 224 and a buffer layer pattern 226 on the thermal oxidation layer pattern 224. The buffer layer pattern 226 may include, for example, silicon nitride or MTO. The buffer layer pattern 226 may be formed by, for example, a thermal oxidation process, a chemical vapor deposition process, a physical vapor deposition process or an atomic layer deposition process. The second gate insulation layer 242 may have a stacked structure of a silicon oxide layer pattern 230 and a silicon oxynitride layer pattern 241. For example, the silicon oxide layer pattern 230 may be formed by a thermal oxidation process. After forming a spacer of silicon nitride on the silicon oxide layer pattern 230, as illustrated in FIG. 12, the spacer may be oxidized to form the silicon oxynitride layer pattern 241, as illustrated in FIG. 13. The third gate insulation layer 240 may be, for example, a gate oxide layer formed by a thermal oxidation process.

The silicon oxide layer pattern 230 and the third gate insulation layer 240 may be an oxide layer formed by substantially the same thermal oxidation processes. The silicon oxide layer pattern 230 and the third gate insulation layer 240 may have a first thickness. The first thickness may be identical to or greater than 100 Å. When the first thickness is smaller than 100 Å, a gate induced leakage current may occur.

In this embodiment, the first gate insulation layer 225 has the stacked structure of the thermal oxidation layer pattern 224 and the buffer layer pattern 226, and the second gate insulation layer 242 has the stacked structure of the silicon oxide layer pattern 230 and the silicon oxynitride layer pattern 241. Accordingly, insulation properties between the gate electrode 246 and the impurity region 250 in the sidewall of the trench 228 may be improved. Thus, as the first and the second gate insulation layers 225 and 242 of the gate insulation layer 244 positioned between the impurity region 250 and the gate electrode 246 in the trench 228 are formed to have relatively greater thicknesses, the gate induced drain leakage may be prevented from occurring, as compared with Embodiment 1 and Embodiment 2.

Only the second gate insulation layer 242 including the stacked structure of the silicon oxide layer pattern 230 and the silicon oxynitride layer pattern 241 is formed within the trench 228 formed in the isolation layer 212 of the isolation region (D). The second gate insulation layer 242 in the isolation layer 212 in the isolation region (D) may be formed on the sidewall and the bottom face of the trench 228.

Hereinafter, a method of manufacturing a recessed channel transistor in accordance with the present embodiment will be explained.

FIGS. 12 and 13 are cross-sectional views illustrating a method of manufacturing the recessed channel transistor of FIG. 11, in accordance with the exemplary embodiment of the present inventive concept. The method according to the present exemplary embodiment is substantially the same as in Embodiment 1 except for processes of forming a trench and a gate insulation layer.

The same processes as described with reference to FIGS. 3 to 6 are performed to form the structure in FIG. 6. Accordingly, a spacer layer 232 is formed on an inner wall of a trench 228 in a semiconductor substrate 200 and on a silicon oxide layer 230 and a buffer layer pattern 226.

Referring to FIG. 12, an anisotropic etch process is performed on the spacer layer 232 until a surface of the semiconductor substrate 200 under a bottom face and a portion of a sidewall of the trench 228 is exposed, to form the spacer 234 on a sidewall of the trench 228 in the active region (A) having the silicon oxide layer 230 formed thereon. The spacer 234 may remain only on a portion of the sidewall of the trench 228. The spacer 234 may be formed using a material having an etch selectivity with respect to the buffer layer pattern 226. The spacer 234 in the active region (A) may be formed only on the sidewall of the trench 228 extending to a first distance from an upper edge of the trench 228, while the spacer 234 in an isolation layer 212 in an isolation region (D) may be formed on the sidewall and the bottom face of the trench 228.

Then, an isotropic etch process may be performed using the spacer 234 as an inner mask to enlarge a lower portion of the trench 228 exposed through the spacer 234 in the active region (A). Accordingly, the lower portion of the trench 228 may have an enlarged ball shape. By performing the isotropic etch process, the channel length under the recessed gate electrode may be increased to prevent a short channel effect and to improve refresh characteristics.

A thermal oxidation process may be further performed on a portion of the semiconductor substrate 200 exposed through the lower portion of the trench 228 to form a protecting layer (not illustrated). The protecting layer may include silicon oxide. Then, in order to remove the buffer layer pattern 226 and the thermal oxidation layer pattern 224 formed in a peripheral circuit region (not illustrated), a second photoresist pattern (not illustrated) may be formed to cover the active region (A) of the semiconductor substrate 200. The buffer layer pattern 226 and the thermal oxidation layer pattern 224 in the peripheral circuit region are sequentially removed using the second photoresist pattern as a mask. The buffer layer pattern 226 and the thermal oxidation layer pattern 224 may be removed by an etch process using plasma. Then, the second photoresist pattern and the protecting layer formed on the lower portion of the trench 228 are removed to expose the active region (A) of the semiconductor substrate 200.

Referring to FIG. 13, a thermal oxidation process is performed on the semiconductor substrate 200 under an oxygen gas containing atmosphere to form a gate insulation layer 244 on the sidewall and the bottom face of the trench 228. The thermal oxidation layer pattern 224 and the buffer layer pattern 226 on the semiconductor substrate 200 adjacent to the upper edge of the trench 228 may be used as a first gate insulation layer 225. By the thermal oxidation process, a second gate insulation layer 242 is formed on the sidewall of the trench 228 extending to a first distance from the upper edge of the trench 228 and a third gate insulation layer 240 is formed on the remaining portion of the sidewall of the trench 228 and the bottom face of the trench 228. The first, second and third gate insulation layers 225, 242, 240 serve as the gate insulation layer 244 of a transistor having a recessed gate electrode.

In particular, a thermal oxidation process is performed to form the gate oxide layer pattern 240 on the inner wall of the trench 228 except the portion of the sidewall of the trench 228 having the spacer 234 and to form a silicon oxynitride layer 241 on the portion of sidewall of the trench 228 having the spacer 234. In the thermal oxidation process, the spacer 234 may be oxidized to form the silicon oxynitride layer pattern 241 on the silicon oxide layer 230 on the sidewall of the trench 228. The second gate insulation layer 242 including the silicon oxide layer 230 and the silicon oxynitride layer 241 may be formed to have a thickness greater than the third gate insulation layer 240 of the gate oxide layer 240. That is, the portion of the gate insulation layer 244 adjacent to the upper edge of the trench 228 and extending to the first distance downwardly from the upper edge of the trench 228 may have a thickness greater than that of the portion of the gate insulation layer 244 on the remaining inner wall of the trench 228. Accordingly, when the channel is formed under the gate oxide layer 240, the gate electrode and the impurity region may be efficiently insulated from each other by the second gate insulation layer 242 on the sidewall of the trench 228. The gate oxide layer 240, the second gate insulation layer 242 and the first gate insulation layer 225 on the semiconductor substrate 200 may be used as the gate insulation layer 244 of a MOS transistor.

In an example embodiment, the gate oxide layer 240 may be the same thermal oxidation layer as the thermal oxidation layer pattern 224 formed by a thermal oxidation process. For example, a thickness of the gate oxide layer 240 may be substantially identical to that of the thermal oxidation layer pattern 224. The third gate insulation layer 240 and the thermal oxidation layer pattern 224 may be (oxide layers having a first thickness. The first thickness may be identical to or greater than 100 Å. When the first thickness is smaller than 100 Å, a gate induced leakage current may occur.

The thermal oxidation layer pattern 224 and the buffer layer pattern 226 are formed on the semiconductor substrate 200 adjacent to the upper edge of the trench 228. Accordingly, the thermal oxidation layer pattern 224 and the buffer layer pattern 226 may be used as an auxiliary insulation layer together with the second gate insulation layer 242 on the sidewall of the trench 228, to thereby prevent a gate induced drain leakage from occurring under the gate spacer 248. Further, the third gate insulation layer 240 may be formed to have a relatively small thickness in the channel region of the recessed channel transistor, to thereby improve current performance of the cell transistor.

Then, the same process as described with reference to FIG. 2 is performed to form a recessed channel transistor 210 having the trench 228 of the enlarged ball shape as illustrated in FIG. 8 and the gate insulation layer 224.

As mentioned above, according to exemplary embodiments, a portion of the gate insulation layer having silicon oxynitride on the sidewall portion of the trench may have a thickness greater than that of a portion of the gate insulation layer on the bottom face of the trench, to thereby prevent a gate induced drain leakage from occurring between the impurity region and the recessed gate electrode in the trench. Further, as the thermal oxidation layer pattern and the buffer layer pattern are formed to have a relatively greater thickness on the semiconductor substrate adjacent to the upper edge of the trench, a gate induced drain leakage may be prevented from occurring in the upper edge of the trench under the gate electrode. Further, the gate insulation layer may be formed to have a smaller thickness on the channel region under the bottom face of the trench, to thereby improve current performance of the cell transistor.

The foregoing is illustrative of example embodiments and is to not be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is to not be construed as limited to the specific example embodiments disclosed, and that modifications to the disclosed example embodiments, as well as other example embodiments, are intended to be included within the scope of the appended claims.

What is claimed is:

1. A recessed channel transistor, comprising:
    an isolation layer provided in a semiconductor substrate to define an active region;
    a trench provided in the semiconductor substrate to extend across the active region;
    a gate insulation layer covering a sidewall and a bottom face of the trench and an upper face of the semiconductor substrate adjacent to an upper edge of the trench, wherein a portion of the gate insulation layer on the upper surface of the semiconductor substrate adjacent to the upper edge of the trench and on the sidewall of the trench extending to a first distance downwardly from the upper edge of the trench has a thickness greater than that of a portion of the gate insulation layer on the remaining sidewall and the bottom face of the trench; and
    a gate electrode filling up the trench having the gate insulation layer formed therein.

2. The recessed channel transistor of claim 1, wherein the gate insulation layer comprises a first gate insulation layer on the upper surface of the semiconductor substrate, and the first gate insulation layer has a stacked structure of a thermal oxidation layer pattern and a buffer layer pattern.

3. The recessed channel transistor of claim 2, wherein the buffer layer pattern comprises at least one of silicon nitride and medium temperature oxide.

4. The recessed channel transistor of claim 1, wherein the gate insulation layer comprises a second gate insulation layer on the sidewall of the trench extending to the first distance downwardly from the upper edge of the trench.

5. The recessed channel transistor of claim 4, wherein the second gate insulation layer comprises a silicon oxynitride layer pattern.

6. The recessed channel transistor of claim 4, wherein the second gate insulation layer has a stacked structure of a silicon oxide layer pattern and a silicon oxynitride layer pattern.

7. The recessed channel transistor of claim 1, wherein the trench comprises:
    a lower portion having a round inner wall profile; and
    an upper portion on the lower portion and having a vertical sidewall profile.

* * * * *